United States Patent [19]

Dietz et al.

[11] Patent Number: 5,391,604
[45] Date of Patent: Feb. 21, 1995

[54] ADHESIVE PASTE CONTAINING POLYMERIC RESIN

[75] Inventors: Raymond L. Dietz, Georgetown; David M. Peck, Danvers, both of Mass.

[73] Assignee: Diemat, Inc., Topsfield, Mass.

[21] Appl. No.: 100,052

[22] Filed: Jul. 30, 1993

[51] Int. Cl.$^6$ ............................................. C08K 3/08
[52] U.S. Cl. ...................................... 524/403; 524/440
[58] Field of Search ............................ 524/440, 403

[56] References Cited

U.S. PATENT DOCUMENTS

| | | | |
|---|---|---|---|
| 4,518,529 | 5/1985 | Stoetzer | 524/440 |
| 4,533,685 | 8/1985 | Hudgin et al. | 524/440 |
| 4,933,030 | 6/1990 | Dietz | 106/1.14 |
| 4,996,171 | 2/1991 | Davey et al. | 501/19 |
| 5,043,102 | 8/1991 | Chen et al. | 252/514 |
| 5,061,549 | 10/1991 | Shores | 428/207 |
| 5,155,066 | 10/1992 | Nguyen | 437/209 |

*Primary Examiner*—Kriellion S. Morgan
*Attorney, Agent, or Firm*—Donald W. Huntley

[57] ABSTRACT

Adhesive paste of organic polymer resin, inorganic filler and fugitive liquid can be used for die attach applications.

10 Claims, No Drawings

ADHESIVE PASTE CONTAINING POLYMERIC RESIN

FIELD OF THE INVENTION

The present invention relates to an adhesive paste particularly well suited for bonding high density, microcircuit electronic components to substrates.

BACKGROUND OF THE INVENTION

The attachment of high density, microcircuit components onto substrates, such as silicon die onto ceramic sheet, has been an important aspect of the electronics industry for many years. Generally, it is known to use a die attach paste which is deposited between the die and substrate. Typically, the die attach paste includes a filler, an adhesive and a carrier. The filler is selected to impart to the finished bonding layer desired conductive, resistive or dielectric properties. The adhesive is chosen to create a strong bond between the die and substrate. The carrier maintains all the components in a fluid, uniform mixture, which allows the paste to be applied easily to the die-substrate interface. It also has suitable volatility to migrate from between the die and substrate and leave a void-free bonding line following heat treatment of the assembly. After the paste is deposited and the die and substrate are assembled, the assembly is typically heated to fuse the adhesive and drive off the carrier. Upon cooling, the die is firmly attached to the substrate.

For the well known silver-glass pastes with organic carrier, the assembly is typically heated to as high as 450° C. U.S. Pat. No. 4,933,030 discloses a silver-glass paste for attaching high density, integrated circuits at temperatures as low as 300° C.

Silver-epoxy resin pastes have been developed to permit die attachment at still lower temperatures. However, epoxy resin pastes have certain drawbacks. Such pastes achieve their adhesive and strength properties by crosslinking of the epoxy resin. The crosslinking process is time consuming and therefore uneconomical. Adjustment of the formulation to crosslink faster reduces the working time during which the paste can be applied to the assembly, thereby complicating the process. Epoxy resins are two part systems consisting of resin and hardener which can require separate storage equipment and must be thoroughly mixed prior to use. Furthermore, epoxy resins generally crosslink to a rigid, unyielding state which can create excessive stress in especially large dies attached to high expansion substrate material. Thus, the die size that can be attached by an epoxy resin paste may be limited. Still further, as a crosslinked material, epoxy resins are not reworkable and therefore should not find appreciable use in the emerging, Multi Chip Module market.

Thermoplastic polymer resin adhesives are candidates for die attachment. Such adhesives suffer from the drawback that the they are solid at low temperatures and thus must be pre-formed to appropriate shape for each attachment application. Furthermore, solid adhesives are incompatible with the industry-standard, high speed production lines based on paste adhesives. In addition, the use of the solid adhesive requires application of pressure to bring about a satisfactory bond. Attempts have been made to provide fluid adhesives based on thermoplastic polymer resins dissolved in solvents. Unfortunately, these systems also suffer from deficiencies, most notably, low upper limits on the amount of silver that can be incorporated while maintaining good adhesive and rheological properties, and the tendency of voids to form following solvent evolution unless excessively long devolatilization times are used.

SUMMARY OF THE INVENTION

The present invention provides a die attach paste which can be processed at low temperatures; is strong, yet sufficiently elastic to bond large silicon die to more expandable substrates without inducing excessive stress; which produces a void-free bonding line; is reworkable as necessary for the Multi Chip Market; and can be applied by equipment and processes in the industry without major modifications.

Specifically the present invention provides an adhesive paste consisting essentially of:

(A) about 7–35 volume percent polymer resin;
(B) about 20–40 volume percent inorganic filler; and
(C) about 37–67 volume percent fugitive liquid;

wherein each of the resin and the filler is present in particulate form of size sufficiently small to pass through a Number 325 mesh screen, and wherein the liquid and the resin are each soluble in the other to less than about 20%.

There is also provided a method of using the paste to bond microcircuit electronic components to substrates so as to produce integrated circuit assemblies useful in the electronics industry.

DETAILED DESCRIPTION OF THE INVENTION

Each of the three principal components of the adhesive paste of the present invention performs the function of the corresponding component of conventional silver-glass pastes, namely, the organic polymer resin provides adhesion, the inorganic filler provides electrical or thermal conductivity properties, or both, and the liquid provides a vehicle for dispensing the paste between the die and substrate. This paste can be used in existing microcircuit assembly process equipment because it has the same rheological and flow characteristics as conventional pastes. It requires heat treatment to much lower temperatures than glass-based adhesives owing to the lower melting points of thermoplastic polymers employed. Because the organic polymer resin is present in fine particulate form and the liquid is chosen so that resin and solvent are substantially mutually insoluble, the liquid can be volatilized during heat treatment, leaving a void-free bonding line. Furthermore, because the thermoplastic resin can be repeatedly melted and solidified, the composition is reworkable and suitable for Multi Chip Module technology.

Each component will be discussed separately, followed by discussion of the complete adhesive and methods for using the adhesive.

The expression "consists essentially of" is intended to mean that the composition may include additional components other than the principal, named components, provided that the additional components are not present in an amount sufficient to detract from the operability of the present invention.

Organic Polymer Resin

Polymer resins suitable for use in this invention include any organic polymer which a) is a solid at temperatures from about room temperature up to the ambient temperature at which microcircuit electronic components operate and b) softens, upon heating to a temperature above the temperature at which microcircuit electronic components operate, to become sufficiently fluid to create an adhesive bond between the components. Epoxy resins can be used. Thermoplastic resins are preferred, which can be repeatedly fused and solidified by heating and cooling to the appropriate temperature range.

The temperature at which a thermoplastic polymer softens and becomes fluid is typically characterized by the Vicat Softening Point. The Vicat Softening Point for many common thermoplastic polymers can be obtained from references well known to those skilled in the art or from the literature provided by the polymer suppliers. Thus the practitioner of ordinary skill can readily check the suitability of a thermoplastic polymer for use in a specific die attach paste by assuring that the Vicat Softening Point lies both sufficiently above the circuitry service temperature to avoid softening during normal operation of the electronic component, and sufficiently below the desired heat treatment temperature.

Representative thermoplastic polymers which can be used include, for example, poly (phenylene sulfides), poly (ether sulfones), polyamides, polyesters, polycarbonates, polysulfones, polyacetals, polyvinyl halides, polyolefins, halogenated polyolefins, acrylic polymers, vinyl polymers and thermoplastic epoxy resins. The thermoplastic resin may be a resin which is capable of being thermoset but which is used at temperatures and conditions which will not thermoset the resin. Such resins include phenol-formaldehyde condensates, urea or melamine-formaldehyde condensates, casein, and gelatin, for example. Additional representative thermoplastic polymers which can be used include copolymers, organic or inorganic substituted polymers, and blends of two or more thermoplastic polymers.

Representative polyamides include poly(hexamethylene adipamide), poly(epsilon-caprolactam), poly(hexamethylene phthalamide and isophthalamide).

Representative polyesters include poly(ethylene terephthalate) and poly(butylene terephthalate).

The resin can contain, in addition to the thermoplastic polymer, minor amounts of additives such as adhesion promoters, thermal stabilizers, antioxidants and tackifiers. Such additives are useful for extending the upper service temperature of the thermoplastic polymer and for increasing the wetting of the surfaces of the die, substrate and inorganic filler materials by the thermoplastic polymer. Such stabilizers, adhesion promoters, antioxidants and tackifiers are well known in the art.

The polymer resin can include a blend of two or more polymers. The blend may even contain a thermosetting polymer component, such as epoxy resin for example; provided that the blend remains essentially thermoplastic, i.e., it can be repeatedly fused and frozen by raising and reducing temperature.

It is important to the successful use of this invention that the polymer resin be present in the paste in fine particulate form, occasionally referred to hereafter as "powder". Some thermoplastic resins are available from the vendor as powder. Others are typically supplied in sheet, pellet, or granular form. Thermoplastic polymer resins not supplied as powder having the desired size distribution characteristics can be comminuted by various well known techniques, such as for example, hammer milling, pin milling, abrasive wheel milling and cryogenic grinding.

The maxiumum particle size of thermoplastic polymer resin powder suitable for use in this invention is about 50 $\mu$m. The thermoplastic powder should be in the form of powder that passes through a No. 325 mesh sieve and preferably, a No. 400 mesh sieve. If the maximum powder particle size is larger than about 50 $\mu$m, appearance of the heat-treated assembly will be depreciated by surface voids in the fillets resulting from particles detaching from the adhesive surface. It has been found that larger particle size also promotes the tendency to form voids in the heat-treated bonding line. While not wishing to be bound by a particular theory, it is believed that the bonding line voids may be produced when large thermoplastic polymer resin particles hold the die away from the substrate during heat treatment. Under such conditions, liquid vaporizes from the paste, causing shrinkage parallel to the bonding line to compensate for the volume of the lost liquid. The minimum particle size of the resin is not critical and is limited by the economics of comminution.

Inorganic Filler

The inorganic filler imparts the desired thermal or electrical properties to the bonding line. Many metals or ceramics well known in the electronics industry can be used. Preferred inorganic fillers include, for example, silver, gold, copper, alumina, beryllia, silica, silicon carbide, tungsten carbide, barium titanate, steatite, boron nitride, aluminum nitride and diamond. The inorganic filler also should be present in fine particulate form and the maximum particle size should be about 50 $\mu$m, and pass a 325 mesh sieve.

The filler is preferably a noble metal, and silver has been found to be particularly satisfactory. Silver powder is typically supplied in flake or spherical particle form. When supplied as flake, silver particles may have a lubricant, typically a fatty acid, such as stearic acid, on the surface as a result of the flaking process. Such lubricants normally decompose at 250° C. or lower and do not ordinarily detract from the operation of this invention. However, the presence of lubricant may affect the selection of liquid, as will be explained hereinafter. Generally, silver particulates which can be used in this invention are smaller than the thermoplastic polymer resin powder. Silvers which can be used include those having a surface area in the range of about from 0.2 to 3 m2/g and a tap density in the range of about from 2 to 5 g/cm3.

Liquid

The fugitive liquid in the present invention functions to suspend the other ingredients so that they can be conveniently dispensed and applied to the die and substrate. Furthermore, the liquid diffuses from the paste and vaporizes during heat treatment to provide an essentially liquid-free, treated adhesive.

The vapor pressure of the liquid should be sufficiently low that it does not rapidly evaporate from the paste at room temperature. This is to avoid reducing the "working life" of the paste. Additionally, if the vapor pressure is too high, it may vaporize during heat treatment too rapidly, which may produce a bond line containing excessive voids. The vapor pressure should be high enough to completely vaporize from the paste within a commercially practical time during heat treatment. The vapor pressure will therefore, at least in part, depend on the conditions of heat treatment. Nevertheless, because the present invention is particularly well suited to low temperature die attachment, the liquid should have room temperature vapor pressure, preferably, of less than about 50 mm Hg.

It is important that the liquid is eliminated during treatment in such a way as to provide a bonding line that is substantially free of voids. Generally, low surface tension and nonpolar liquids provide void-free bonding lines, and are therefore preferred. Representative liquids which can be used are aliphatic and aromatic hydrocarbons, and glycol ethers and their derivatives such as glycol ether acetates, having a boiling point of about from 150° C. to 275° C. Particularly satisfactory are aliphatic hydrocarbons.

It is believed that reaction between the lubricant residue normally on the surface of silver flake and the liquid may cause voids in the bond line. Thus it is desirable that the liquid used be compatible with the inorganic filler and resin in the paste to the extent that voids are not generated on removal of the solvent.

The liquid is substantially a nonsolvent for the thermoplastic polymer resin. That is, each of the resin and the liquid is not significantly soluble in the other. However, a slight solubility, up to about 20 percent of the total resin, and preferably, less than 10 percent, can be tolerated. If the liquid is more soluble in the resin, liquid may take too long to diffuse out of the fusing resin to the surface of the particles. If the resin is more soluble in the liquid, it may tend to form a film barrier which excessively retards the devolatilization of liquid from the bonding line. As heat treatment progresses in such circumstances, the liquid in the bond line vaporizes and expands to produce voids.

Generally, organic liquids known for their use in conventional, glass-filler die attachment paste, can be used in the present invention, provided that such organic liquids possess the volatility and solubility properties identified above. The liquid can be a solution of two or more liquid compounds.

Die Attach Adhesive and Use

A particular advantage of this die attach adhesive is its similarity in performance to conventional, glass-based adhesive pastes, except for its ability to undergo heat treatment at relatively low temperatures. Therefore the preparation of the adhesive from its principal components, and its methods of application and use, take advantage of the various methods and employ equipment well known in the art. In effect, this die attach adhesive is a low treatment temperature, "drop-in" replacement for inorganic—(i.e., glass—) based die attach and thick film pastes.

The die attach adhesive of the present invention is a uniform mixture of polymer resin, inorganic filler and liquid. The principal components can be mixed in equipment known in the art for paste preparation. It should be recognized that thermoplastic polymers chosen for a specific paste application will have significantly lower fusion point than the glass of conventional pastes. Accordingly, it may be necessary to operate the mixing apparatus at slower speed and/or less intense agitation; with slightly smaller recipe of ingredients; with cooling; or with a combination of the preceding, in order to avoid coalescing of the thermoplastic polymers. These techniques may be necessary to assure that the thermoplastic polymer resin is present in fine particulate form prior to heat treatment.

The order of mixing the ingredients is not critical. All the principal components can be blended together. Alternatively, combinations of two principal components can be premixed followed by addition of other components to produce the paste. For example, it may be desired to first produce a dry blend of the thermoplastic polymer resin and the inorganic filler by known methods of powder mixing, such as by using ribbon or double-cone tumble blenders. Thereafter, liquid can be added to the dry mixture to form the paste.

The adhesive composition prior to heat treatment will preferably contain about 24–37 volume % inorganic filler. Preferably, the composition will contain 11–37 volume % and more preferably, 13–29 volume % thermoplastic polymer resin.

It is known that thermoplastic polymers typically have maximum service temperatures above which they degrade, increasingly decomposing as the combination of high temperature and exposure time becomes more severe. The ordinary skilled practitioner will appreciate that heat treatment temperature cycles customary for glass pastes should be adjusted to avoid degradation of the thermoplastic polymer.

The liquid also should provide a smooth paste which dispenses cleanly to the bond line without dripping or tailing. Normally, the viscosity of the paste can be adjusted by changing the proportions of ingredients, as will be evident to the skilled practitioner.

The die attach adhesive of this invention is also useful in many thick film paste applications, such as for example, the fabrication of hybrid circuits in which conductive, resistive and dielectric pastes are screen printed onto substrate materials and heat treated to bond the desired printed circuit to the substrate.

The present invention also provides a process for attaching a microcircuit electronic component to a substrate. In general, this process comprises making an adhesive paste of the present invention; followed by applying the paste to a surface of a substrate to form a bond line and placing the electronic component on the bond line so that the paste is between the electronic component and the substrate; followed by heating the assembly to a sufficiently high temperature for a sufficient time that the thermoplastic resin softens and becomes fluid, but does not degrade, and the liquid devolatilizes from the paste; followed by cooling the heat-treated assembly to a temperature below which the thermoplastic polymer becomes solid, whereby the microcircuit electronic component is bonded to the substrate by a void-free bond line.

EXAMPLES

This invention is now illustrated by examples of certain representative embodiments thereof, where all parts, proportions, and percentages are by volume unless otherwise indicated. The examples are intended to be illustrative only, and modifications and equivalents of the invention will be evident to those skilled in the art. All units not originally obtained in SI units have been converted to SI units.

The materials used in the examples are summarized in Table I. Thermoplastic polymer resins were supplied by the vendor in powder form or in sheet or pellet form. Those supplied as sheets or pellets were ground to powder form using a high rotation speed, abrasive wire wheel. All thermoplastic polymer resin powders were passed through 325 mesh screen sieves to assure that maximum particle size was less than 50 $\mu$m.

Filler was first combined with a portion of liquid to make a blend of about 37–44 % filler. The blend was processed on a 3-roll mill to uniformly disperse the materials and form a filler paste. The filler paste was combined with sufficient organic polymer resin and additional liquid to produce a blend of composition as indicated in Table II. This blend was processed on a 3-roll mill to produce a substantially uniform concentration, die attach paste.

To measure bond strength, 13 microliters of die attach paste was deposited on a bare ceramic sheet. An 8.6 mm×8.6 mm, silicon die was placed over the paste. The assembly was heated in a furnace at an average rate of 10° C. per minute until the temperature indicated in Table II was reached. The sample was maintained at temperature for the duration also indicated in the table. Thereafter, the sample was removed from the furnace and cooled to room temperature. An aluminum stud was fastened to the die with epoxy adhesive and pulled off with a Sebastian III stud puller. Bond strength was recorded directly from the stud puller. To measure voids created in the bond line, a transparent glass microscope slide was substituted for the die and the procedure was repeated except that 70 microliters of paste was placed on the ceramic sheet. The glass slides used for voiding experiments were 18mm×18mm in size. Voids were characterized by visual inspection.

Results of the examples are also summarized in Table II. Table II is listed by volume percent to accomodate the densities of the various filler materials that could be used. Bond strength was considered good if it exceeded about 4.5 kg to about 6.8 kg (10–15 lbs). Examples 1 and 2 demonstrate that the die attach paste of the present invention can produce strong, void-free bonds at heat treatment of short duration at 290° C. and slightly longer at 350° C. In Comparative Examples A and B, the thermoplastic polymer resin of Examples 1 and 2 was diluted with 20 % of polysulfone predissolved in methyl benzoate. Void formation was massive but reduced to a still unacceptable, but moderate amount, as the percent of resin in solution decreased. A smaller amount of polysulfone produced void-free bond lines in Example 3-5, which also show decreasing bond strength with decreasing resin amount. In Example 6, 20% polysulfone produced a satisfactory bond line because the amount of total resin was in solution reduced.

Comparative Example C demonstrates the performance of epoxy as the polymer resin. Epoxy is a thermosetting polymer, consequently, the bond strengths are too low. Bond strengths improve with increasing amounts of epoxy. However, strength is only marginal at over 30% epoxy in the paste.

Examples 9–11 show that the present invention can produce marginally strong bond lines at less than 200° C. heat treatment.

Examples 12–19 demonstrate effectiveness of this invention at producing strong, void-free bonds at treatment temperatures in the range of 150°–250° C. As temperature is lowered, treatment time is extended. Also, bond strength decreases with reduced thermoplastic polymer resin content. Resistivity of Example 18 was measured as 57×10-6 ohm-cm, which is higher than that of glass-based pastes but much lower than that of typical epoxy-based pastes.

Comparative Example D shows that excessive solubility between liquid and resin produces massive voiding of the bond line. Massive voiding is seen in Comparative Examples E and F, which is believed to be due to the incompatibility of the solvent with the silver flake surfactant.

TABLE I

| | |
|---|---|
| Thermoplastic Polymer Resin | |
| TP1 | UDEL P3703 (Amoco) Polysulfone |
| TP2 | UDEL P1800 (Amoco) Polysulfone |
| TP3 | Ultrason E (BASF) Poly (ether sulfone) |
| TP4 | Fortron (Hoechst) Poly (phenylene sulfide) |
| TP5 | MR11 (Phillips) Poly (phenylene sulfide) |
| TP6 | VI (Phillips) Poly (phenylene sulfide) |
| TP7 | GR01 (Phillips) Poly (phenylene sulfide) |
| TP8 | Siltem (General Electric) Poly (etherimide siloxane) |
| TP9 | 5183 (Bostik) Polyester |
| TP10 | 5157 (Bostik) Polyester |
| TP11 | LP3000-G (Farboil) Polyester |
| TP12 | Farboset 9146 (Farboil) Epoxy |
| Liquid | |
| L1 | EXXAL #9 (Exxon) isononyl alcohol |
| L2 | NMP (Aldrich) methyl pyrrolidone |
| L3 | Methyl benzoate |
| L4 | Terpineol 318 (Hercules) terpene alcohol |
| L5 | 673 (Exxon) Dearomatized aliphatic |
| L6 | 686 (Exxon) Dearomatized aliphatic |
| L7 | Suresol 157 (Koch) aromatic diisopropyl benzene |
| L8 | DBE (DuPont) aliphatic dibasic ester |
| Inorganic filler | |
| F1 | 15ED #001 (Metz) Silver flake |
| F2 | 15ED #173 (Metz) Silver flake |
| F3 | 3000-1 (Metz) Silver powder |
| F4 | EA295 (Chemet) Silver flake |

TABLE 11

| | Thermoplastic Polymer Resin | | Liquid | | Filler | | Heat Treatment | | Voids in Bond | Bond Adh |
|---|---|---|---|---|---|---|---|---|---|---|
| Example | Type | Vol % | Type | Vol % | Type | Vol % | minutes | °C. | Line | (kg) |
| 1 | TP5 | 21.8 | L3 | 54.8 | F4 | 23.4 | 2 | 290 | None | 11.8 |
| A | 80% TP5/20% TP2 | 21.8 | L3 | 54.8 | F4 | 23.4 | 2 | 290 | High | 51.8 |
| B | 80% TP5/20% TP2 | 19.2 | L3 | 60.2 | F4 | 20.6 | 5 | 350 | Moderate | 52.7 |
| 2 | TP5 | 19.2 | 50% L8/ 50% L4 | 60.2 | F4 | 20.6 | 5 | 350 | None | 35.5 |
| 3 | 90% TP5/10% TP2 | 19.2 | L3 | 60.2 | F4 | 20.6 | 5 | 350 | None | 39.1 |
| 4 | 90% TP5/10% TP2 | 17.2 | L3 | 59.2 | F4 | 23.6 | 5 | 350 | None | 37.7 |
| 5 | 90% TP5/10% TP2 | 14.0 | L3 | 59.8 | F4 | 26.2 | 5 | 350 | None | 15.0 |
| 6 | 80% TP5/20% TP2 | 13.4 | L3 | 61.5 | F4 | 25.1 | 5 | 350 | None | 24.1 |
| C | TP12 | 12.3 | L5 | 52.5 | F4 | 35.2 | 5 | 305 | None | 4.1 |
| 7 | TP12 | 22.2 | L5 | 47.4 | F4 | 30.4 | 5 | 305 | None | 5.5 |
| 8 | TP12 | 30.4 | L5 | 43.1 | F4 | 26.5 | 5 | 305 | None | 7.3 |
| 9 | TP9 | 17.5 | L5 | 49.8 | F4 | 32.7 | 8 | 175 | None | <4.5 |
| 10 | TP9 | 21.7 | L5 | 48.5 | F4 | 29.8 | 8 | 175 | None | 6.4 |
| 11 | TP9 | 25.4 | L5 | 47.4 | F4 | 27.2 | 8 | 175 | None | 8.6 |
| 12 | TP9 | 25.4 | L7 | 47.4 | F4 | 27.2 | 20 | 150 | None | 12.7 |
| 13 | TP9 | 25.4 | L5 | 47.4 | F4 | 27.2 | 10 | 250 | None | 12.3 |
| 14 | TP9 | 25.4 | L5 | 47.4 | F4 | 27.2 | 2 | 200 | None | 31.8 |

TABLE 11-continued

| Example | Thermoplastic Polymer Resin Type | Thermoplastic Polymer Resin Vol % | Liquid Type | Liquid Vol % | Filler Type | Filler Vol % | Heat Treatment minutes | Heat Treatment °C. | Voids in Bond Line | Bond Adh (kg) |
|---|---|---|---|---|---|---|---|---|---|---|
| 15 | TP9 | 25.4 | L5 | 47.4 | F4 | 27.2 | 24 | 175 | None | 25.9 |
| 16 | TP9 | 25.4 | L5 | 47.4 | F2 | 27.2 | 25 | 175 | None | 25.9 |
| 17 | TP9 | 21.3 | L5 | 49.6 | F2 | 29.1 | 25 | 175 | None | 29.5 |
| 18 | TP9 | 16.7 | L5 | 52.1 | F2 | 31.2 | 25 | 175 | None | 20.5 |
| 19 | TP9 | 11.7 | L5 | 54.8 | F2 | 33.5 | 25 | 175 | None | 7.3 |
| D | TP9 | 15.9 | L3 | 62.3 | F2 | 21.8 | 25 | 175 | High | <4.5 |
| E | TP2 | 16.0 | L1 | 66.8 | F1 | 17.2 | 5 | 350 | High | 8.6 |
| F | TP3 | 16.0 | L1 | 66.8 | F1 | 17.2 | 5 | 350 | High | 18.2 |

We claim:

1. An adhesive paste consisting essentially of:
   (A) about 7–35 volume percent organic polymer resin;
   (B) about 20–40 volume percent noble metal filler; and
   (C) about 37–67 volume percent fugitive liquid;
   wherein each of the resin and the filler is present in particulate form of size sufficiently small to pass through a Number 325 mesh screen, and wherein the liquid and the resin are each substantially insoluble in the other.

2. An adhesive paste of claim 1 wherein the organic polymer resin is thermoplastic.

3. An adhesive paste of claim 2 wherein the thermoplastic is selected from the group consisting of polysulfones, poly (phenylene sulfides), poly (ether sulfones) and polyesters.

4. An adhesive paste of claim 1 wherein the fugitive liquid is selected from aliphatic and aromatic hydrocarbons and glycol ethers having boiling points of about from 150° to 275° C.

5. An adhesive paste of claim 1 wherein the inorganic filler has a thermal conductivity of at least about 15 watts/m−°K.

6. An adhesive paste of claim 5 wherein the filler has an electrical resistivity of less than about $1 \times 10^{-5}$ ohm-cm.

7. An adhesive paste of claim 1 wherein the inorganic filler consists essentially of silver.

8. An adhesive paste of claim 7 wherein the inorganic filler has a surface area of about from 0.2 to 3.0 m²/g.

9. An adhesive paste of claim 7 wherein the inorganic filler has a tap density of about 2–5 g/cc.

10. A process for assembling an electronic component on a substrate, comprising the steps of:
   i) depositing an adhesive paste on a substrate, the paste consisting essentially of;
      (A) about 7–35 volume percent organic polymer resin;
      (B) about 20–40 volume percent inorganic filler; and
      (C) about 37–67 volume percent fugitive liquid;
      wherein each of the resin and the filler is present in particulate form of size sufficiently small to pass through a Number 325 mesh screen, and
      wherein the liquid and the resin are each soluble in the other to less than about 20%;
   ii) placing an electronic component on the substrate in contact with the adhesive paste;
   iii) heating the resulting assembly to a temperature above which the polymer resin softens and becomes fluid and below a temperature at which the thermoplastic polymer resin begins to degrade; and
   iv) cooling the assembly whereby the thermoplastic polymer resin solidifies to bond the electronic component to the substrate.

* * * * *